United States Patent
Chang et al.

(10) Patent No.: US 8,759,831 B2
(45) Date of Patent: Jun. 24, 2014

(54) THIN FILM TRANSISTOR ARRAY STRUCTURE AND MANUFACTURING METHOD THEREOF

(75) Inventors: Wei-Hung Chang, Shenzhen (CN); Chengming He, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 229 days.

(21) Appl. No.: 13/375,231

(22) PCT Filed: Oct. 25, 2011

(86) PCT No.: PCT/CN2011/081223
§ 371 (c)(1),
(2), (4) Date: Nov. 30, 2011

(87) PCT Pub. No.: WO2013/026229
PCT Pub. Date: Feb. 28, 2013

(65) Prior Publication Data
US 2013/0043472 A1 Feb. 21, 2013

(30) Foreign Application Priority Data
Aug. 19, 2011 (CN) .......................... 2011 1 0239955

(51) Int. Cl.
*H01L 31/00* (2006.01)
*H01L 21/00* (2006.01)
(52) U.S. Cl.
USPC .................. 257/59; 438/34; 257/E33.062
(58) Field of Classification Search
USPC .................................................. 257/E33.062
See application file for complete search history.

(56) References Cited

U.S. PATENT DOCUMENTS

| 6,495,857 | B2 * | 12/2002 | Yamazaki | ..................... 257/59 |
| 2001/0010567 | A1 * | 8/2001 | Rho et al. | ..................... 349/43 |
| 2003/0020847 | A1 * | 1/2003 | Kim et al. | ..................... 349/43 |
| 2003/0020852 | A1 | 1/2003 | Chang et al. | |

FOREIGN PATENT DOCUMENTS

| CN | 1693973 A | 11/2005 |
| CN | 101950095 A | 1/2011 |
| CN | 102053407 A | 5/2011 |
| JP | 1090719 A | 4/1998 |
| KR | 100951840 B1 | 4/2010 |

OTHER PUBLICATIONS

International Search Report of the PCT Application No. PCT/CN2011/081223.

(Continued)

*Primary Examiner* — Lex Malsawma

(57) ABSTRACT

A thin film transistor (TFT) array structure for a liquid crystal display (LCD) includes a panel, a first conductive layer, a middle layer, a second conductive layer, a passivation layer, and a black electrode layer. The first conductive layer is formed on the panel using filming technologies and a first photo-mask process. The middle layer is deposited and formed on the first conductive layer using a second photo-mask process. The second conductive layer is formed on the middle layer using a third photo-mask process and a first etching operation. The passivation layer is deposited and formed on the middle layer and the second conductive layer using a forth photo-mask process and a second etching operation. The black electrode layer formed on the passivation layer. The TFT array structure and the manufacturing method of the present disclosure reduce the consumption of the voltage and improve the display effect of the LCD.

19 Claims, 6 Drawing Sheets

(56) References Cited

OTHER PUBLICATIONS

1st Office Action of Chinese Patent Application No. 201110239955.9 issued by Chinese Patent Office.

2nd Office Action of Chinese Patent Application No. 201110239955.9 issued by Chinese Patent Office.

3rd Office Action of Chinese Patent Application No. 201110239955.9 issued by Chinese Patent Office.

* cited by examiner

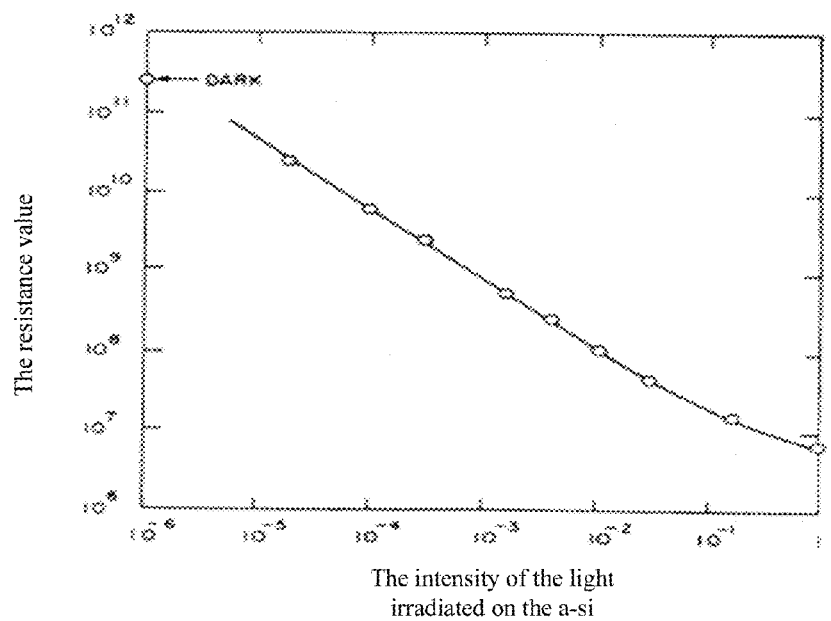
FIG. 6
(RELATED ART)
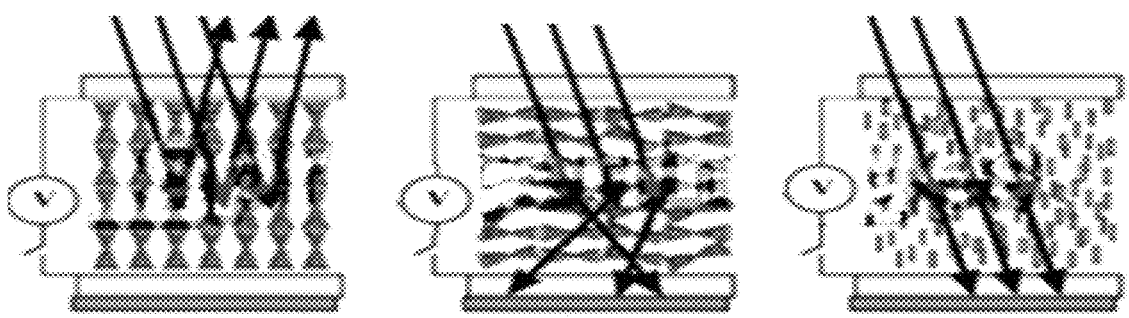
FIG. 7A
(RELATED ART)
FIG. 7B
(RELATED ART)
FIG. 7C
(RELATED ART)

THIN FILM TRANSISTOR ARRAY STRUCTURE AND MANUFACTURING METHOD THEREOF

BACKGROUND

1. Technical Field

The present disclosure relates to a thin film transistor array structure and a manufacturing method thereof.

2. Description of Related Art

Referring to FIG. 5, a conventional reflective cholesteric liquid crystal display (cholesteric LCD) often includes a thin film transistor (TFT) array structure. The TFT array structure often includes two panels 10, a first conductive layer 11, a middle layer 12, a second conductive layer 13, a passivation layer 14, two COM electrodes 15, an absorption layer 16, and a liquid crystal layer 17. The middle layer 12 includes an insulating layer 121 and a semiconductor and $N^+$ layer 122. The semiconductor in some cases may be amorphous silicon (abbreviated to a-Si). The absorption layer 16 is configured for providing a dark state to the cholesteric LCD. As shown in FIG. 6, the electric conductivity of the a-Si is proportional to the intensity of the light irradiated thereon, therefore, the absorption layer 16 can prevent the semiconductor from turning off for the light irradiated thereon, and further prevent the leak of the electricity.

Referring to FIGS. 7a to 7c, a cholesteric LCD can work three states including a bright state, a dark state, and a refresh state. Since the absorption layer 16 of the TFT array structure of the conventional cholesteric LCD cannot absorb the scattering light from the reflexive light completely, the cholesteric LCD needs to work in the refresh state before switching into a predetermined image. Since the cholesteric LCD works in the refresh state under a high voltage (20-30 volts), and the absorption layer 16 and the COM electrodes 15 may divide a part of the voltage supplied to the cholesteric LCD, therefore, the cholesteric LCD often cannot work in the refresh state properly.

SUMMARY

One object of the present disclosure is to provide thin film transistor (TFT) array structure for a liquid crystal display (LCD). The TFT array structure includes two panels, a first conductive layer, a middle layer, a second conductive layer, a passivation layer, and a black electrode layer. The first conductive layer is formed on the panel using filming technologies and a first photo-mask process. The middle layer is deposited and formed on the first conductive layer using a second photo-mask process. The second conductive layer is formed on the middle layer using a third photo-mask process and a first etching operation. The passivation layer is deposited and formed on the middle layer and the second conductive layer using a forth photo-mask process and a second etching operation. The black electrode layer is formed on the passivation layer.

Preferably, the middle player includes an insulating layer and a semiconductor and $N^+$ layer sequentially formed on first conductive layer.

Preferably, the passivation layer is etched to define a contact hole.

Preferably, the black electrode layer is capable of filling in the contact hole to allow the black electrode layer to conduct with the second conductive layer.

Preferably, the black electrode layer is made of conductive absorbable material.

Another object of the present disclosure is to provide a manufacturing method of a thin film transistor array structure including the following steps:

forming a first conductive layer on a panel using filming technologies and a first photo-mask process;

depositing and forming a middle layer on the first conductive layer using a second photo-mask process;

forming a second conductive layer on the middle layer using a third photo-mask process and a first etching operation;

depositing and forming a passivation layer on the middle layer and the second conductive layer using a forth photo-mask process and a second etching operation forming a black electrode layer on the passivation layer.

Preferably, the step of depositing a middle layer on the first conductive layer and forming the middle layer using a second photo-mask process includes the following steps:

depositing an insulating layer on the first conductive layer;

forming a semiconductor and $N^+$ layer on the insulating layer using the second photo-mask process and the second etching operation.

Preferably, the step of depositing and forming a passivation layer on the middle layer and the second conductive layer using a forth photo-mask process and a second etching operation further comprises the step of defining a contact hole in the passivation layer.

Preferably, the step of depositing and forming a passivation layer on the middle layer and the second conductive layer using a forth photo-mask process and a second etching operation further includes the step of filling in the contact hole with the black electrode layer to allow the black electrode layer to conduct with the second conductive layer.

Preferably, the black electrode layer includes a pixel electrode and a thin film transistor light-shielding electrode electrically separated from the pixel layer, and the step of forming the black electrode layer includes the following step:

forming the pixel electrode and the thin film transistor light-shielding electrode on the passivation layer and filling in the contact hole with the pixel electrode.

A further object of the present disclosure is to provide a TFT array structure for a LCD. The TFT array structure includes a panel, a first conductive layer, a middle layer, a second conductive layer, a passivation layer, and a black electrode layer. The first conductive layer is formed on the panel using filming technologies and a first photo-mask process. The middle layer is deposited and formed on the first conductive layer using a second photo-mask process, and includes an insulating layer and a semiconductor and $N^+$ layer sequentially formed on the first conductive layer. The second conductive layer is formed on the middle layer using a third photo-mask process and a first etching operation. The passivation layer is deposited and formed on the middle layer and the second conductive layer using a forth photo-mask process and a second etching operation. The black electrode layer is formed on the passivation layer and is made of conductive absorbable material.

Preferably, the passivation layer is etched to define a contact hole.

Preferably, the black electrode is capable of filling in the contact hole to allow the black electrode layer to conduct with the second conductive layer.

Preferably, the black electrode layer includes a pixel electrode and a thin film transistor light-shielding electrode separated from the pixel electrode, and the light-shielding electrode fills in the contact hole and conducts with the second conductive layer.

In the TFT array structure of the present disclosure, the black electrode replaces a COM electrode and an absorption layer in the conventional FTF array structure, and is formed on the passivation layer using traditional filming technologies, which not only reduces the manufacturing process of making the omitted COM electrode layer and the absorption layer, but also allows the liquid crystal layer to work under an external voltage high enough since there is no need to divide a part of the external voltage to the omitted COM electrode and the absorption layer. Therefore, the display effect of the LCD can be improved.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

FIG. 6 is a schematic view showing the relationship between an electric conductivity of the a-Si of the TFT array structure of FIG. 5 and an intensity of the light irradiated thereon.

FIGS. 7a to 7c are schematic views showing three states in which the cholesteric LCD of FIG. 5 may work.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
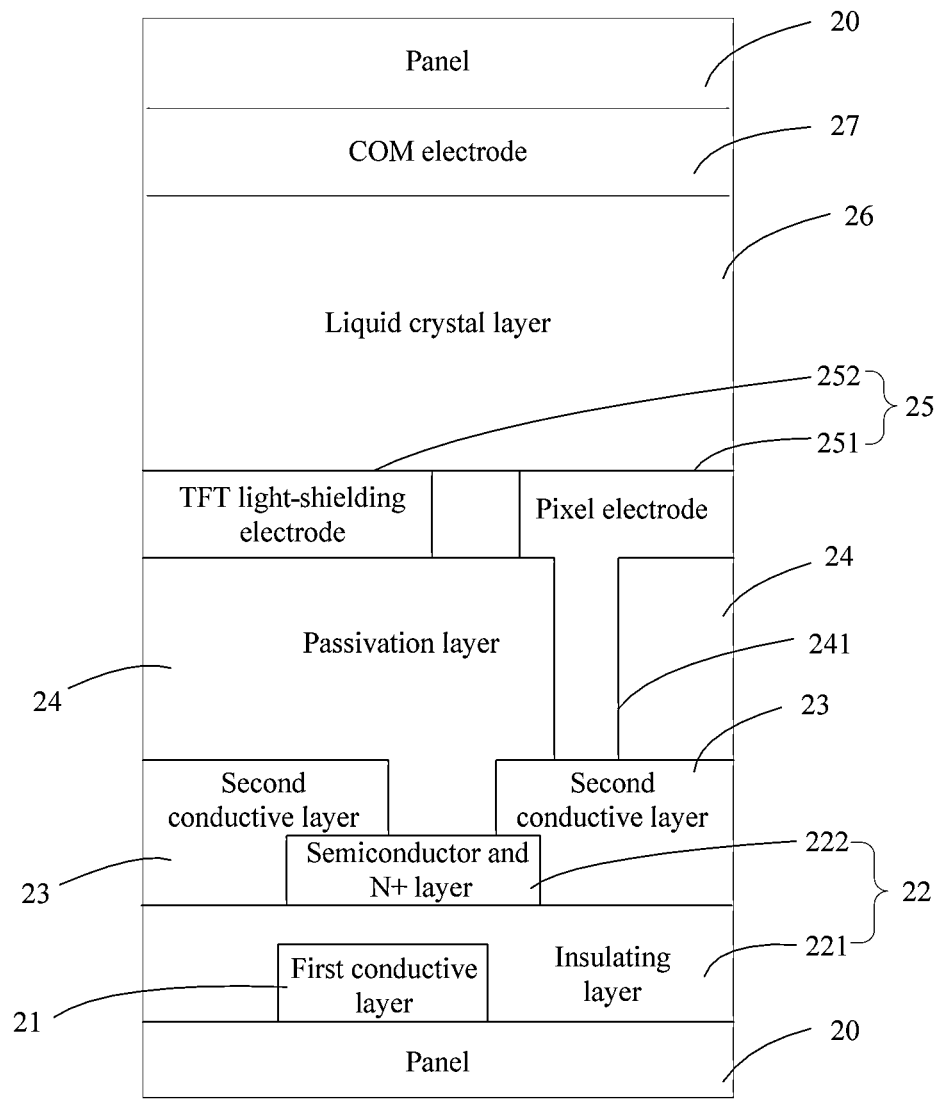
FIG. 1 is a schematic view of a thin film transistor (TFT) array structure of a cholesteric liquid crystal display (LCD) in accordance with an embodiment of the present disclosure.

Referring to FIG. 1, a thin film transistor (TFT) array structure includes two panels 20. A first conductive layer 21, a middle layer 22, a second conductive layer 23, a passivation layer 24, a black electrode layer 25, a liquid crystal layer 26, and a COM electrode 27 are sequentially sandwiched between the two panels 20. The first conductive layer 21 is formed on one of the two panels 20 using filming technologies and a first photo-mask process. The middle layer 22 is deposited on the first conductive layer 21 and is formed using a second photo-mask process. In the embodiment, the middle layer 22 includes an insulating layer 221 and a semiconductor and $N^+$ layer 222. In the embodiment, the insulating layer 221 may be made of material such as silicon nitride (SiNx), and the semiconductor of the semiconductor and $N^+$ layer may be amorphous silicon (abbreviated to a-Si). The second conductive layer 23 is formed on the middle layer 22 using a third photo-mask process and a first etching operation. The passivation layer 24 is deposited and formed on the middle layer 22 and the second conductive layer 23 using a forth photo-mask process and a second etching operation. The black electrode layer 25 and the liquid crystal layer 26 are sequentially formed on the passivation layer 24. The COM electrode 27 is sandwiched between the liquid crystal layer 26 and the other one of the two panels 20.

Figure 2A:
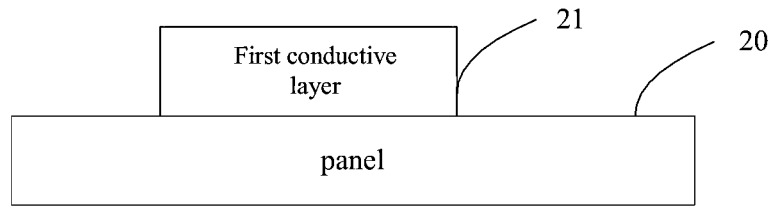
FIGS. 2A to 2E are partially schematic views of the TFT array structure of FIG. 1.

Referring to FIG. 2A, when forming the first conductive layer, metal is sputtered on one of the two panels 20 at first to form a first metal layer. The position of the first conductive layer 21 then is defined on the first metal layer using the first photo-mask process. The first conductive layer 21 then is etched to allow surplus material to be removed from the panel 20. In the embodiment, the first conductive layer 21 may include a single layer or a number of sub-layers.

Figure 2B:
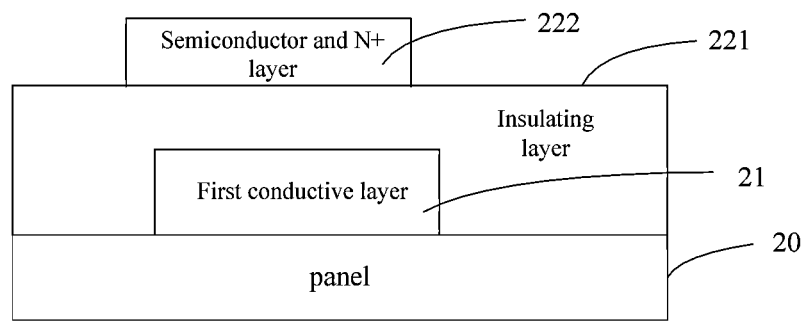

Referring to FIG. 2B, the insulating layer 221 is deposited on the first conductive layer 21. The position of the semiconductor and $N^+$ layer 222 then is defined on the insulating layer 221 using the second photo-mask process.

Figure 2C:
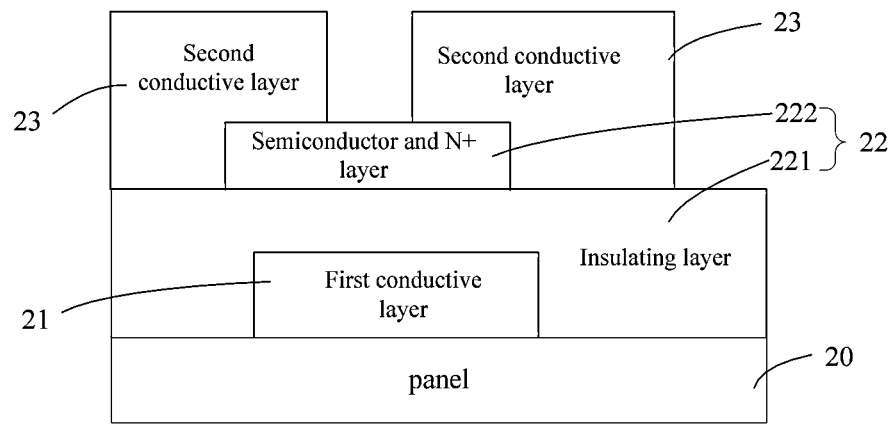

Referring to FIG. 2C, metal is sputtered on the insulating layer 221 and the semiconductor and $N^+$ layer 222 to form a second metal layer. The second photo-mask process and a first etching operation then are applied to the second metal layer to define the position and the shape of the second conductive layer 23 respectively. In this state, an active matrix including the first conductive layer 21, the middle layer 22, and the second conductive layer 23 is formed. In some embodiments, the second conductive layer 23 also may include a single layer or a number of sub-layers.

Figure 2D:
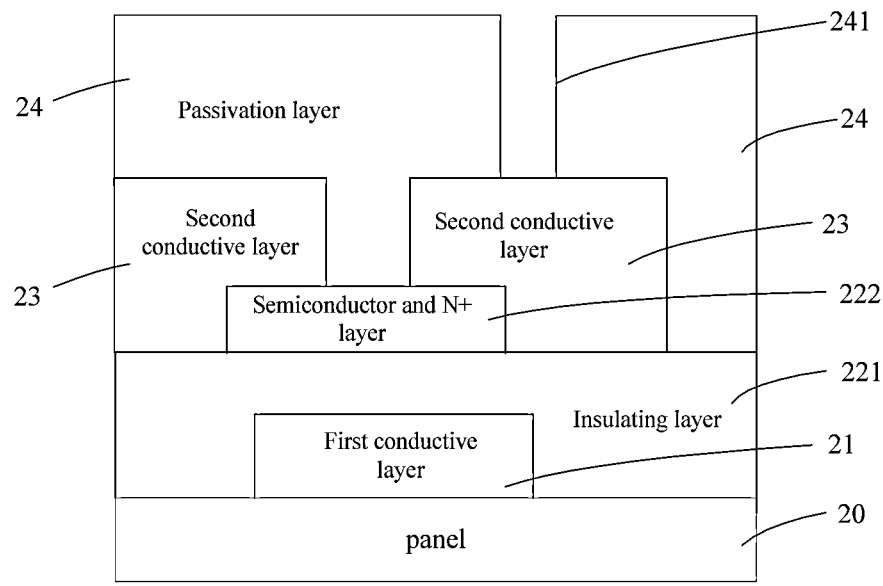

Referring to FIG. 2D, the passivation layer 24 is deposited and formed on the middle layer 22 and the second conductive layer 23. A contact hole 241 is defined in the passivation layer 24 using the forth photo-mask process.

Figure 2E:
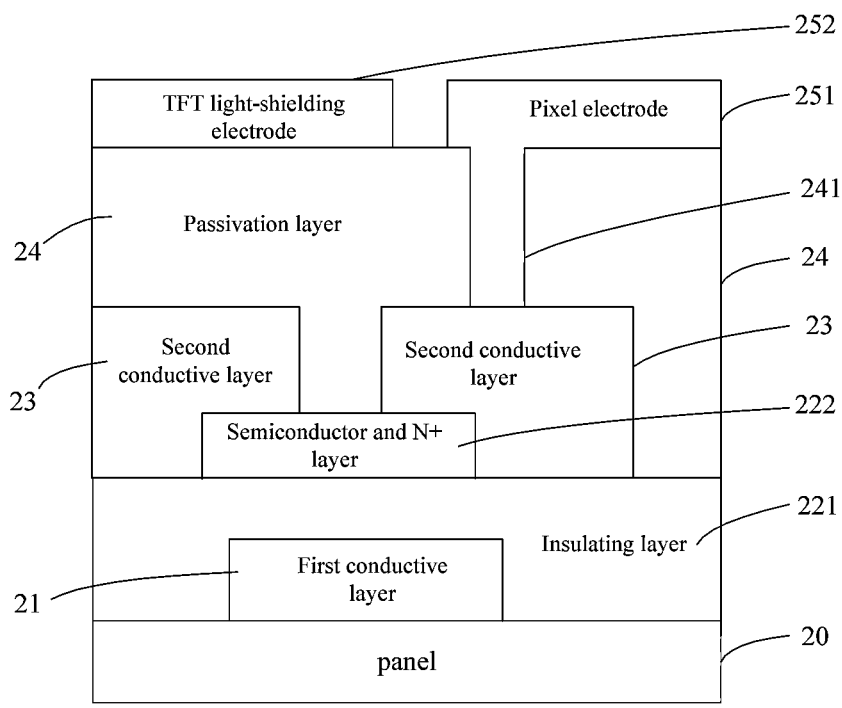

Referring to FIG. 2E, the black electrode layer 25 is deposited on the passivation layer 24 and is formed using a fifth photo-mask process. The black electrode layer 25 is capable of filling in the contact hole 241 to allow the second conductive layer 23 to conduct with the black electrode layer 25. The black electrode layer 25 then is etched to form a pixel electrode 251 and a light-shielding electrode 252 separated from the pixel electrode 251. The pixel electrode 251 is partly extended towards the second conductive layer 23 through the contact hole 241 to conduct with the second conductive layer 23.

It is understandable that in some embodiments, the black electrode layer 25 may be made of conductive absorbable material such as a mixture of conductive macromolecular and BM resin, a mixture of carbon nanotube and BM resin, and a mixture of conductive macromolecular material and black dye.

In the above TFT array structure of the present disclosure, the black electrode layer 25 replaces one of the two COM electrode layers and the absorption layer of the conventional TFT array structure, which not only reduces the forming process of making the omitted COM electrode layer and the absorption layer, but also allows the liquid crystal layer 26 to work under an external voltage high enough since there is no need to divide a part of the external voltage to the omitted COM electrode and the absorption layer. Therefore, the display effect of the LCD can be improved.

The advantage of replacing the COM electrode layer and the absorption layer of the conventional TFT array structure with the black electrode layer 25 will be described in detailed as the followings.

In the conventional TFT array structure with the two COM electrodes and the absorption layer, the capacitance of the liquid crystal layer 26 and the absorption layer can be described according to the two following formulas respectively:

$$C_1 = \varepsilon_1 \frac{A}{d_1}; \quad (1)$$

$$C_2 = \varepsilon_2 \frac{A}{d_2} \quad (2)$$

(wherein $d_1$ is a thickness of the liquid crystal layer 26, and $d_2$ is a thickness of the absorption layer, $\in_1$ is a dielectric constant of the liquid crystal layer, and $\in_2$ is a dielectric constant of the absorption layer). Since the external voltage (V(s)) is partly divided to the absorption layer, a working external voltage $V_{LCeff}$ across the liquid crystal layer 26 can be calculated according to following expression:

$$V_{LCeff} = V(s) \frac{\frac{1}{sC_1}}{\frac{1}{sC_1} + \frac{1}{sC_2}} = \quad (3)$$

$$V(s) \frac{C_2}{C_1 + C_2} = V(s) \frac{\frac{\varepsilon_2}{d_2}}{\frac{\varepsilon_1}{d_1} + \frac{\varepsilon_2}{d_2}} = V(s) \frac{\varepsilon_2 d_1}{\varepsilon_1 d_2 + \varepsilon_2 d_1}$$

According to the above expression, the $V_{LCeff}$ will be about 0.67 volts when $d_1$ and $d_2$ are respectively 4 μm and 1 μm, $\in_1$ and $\in_2$ are respectively 8 and 4. That is, the working voltage $V_{LCeff}$ applied to the liquid crystal layer 26 is only 67% of the external voltage V(s). However, in the present disclosure, since the black electrode layer 25 replaces the COM electrode layer and the absorption layer of the conventionally TFT array structure, the external voltage V(s) can be applied to the liquid crystal layer 26 completely. Thus, the power consumption is reduced and the working voltage the liquid crystal layer 26 needing can be reduced to 30%~40% of the original value.

Figure 3:
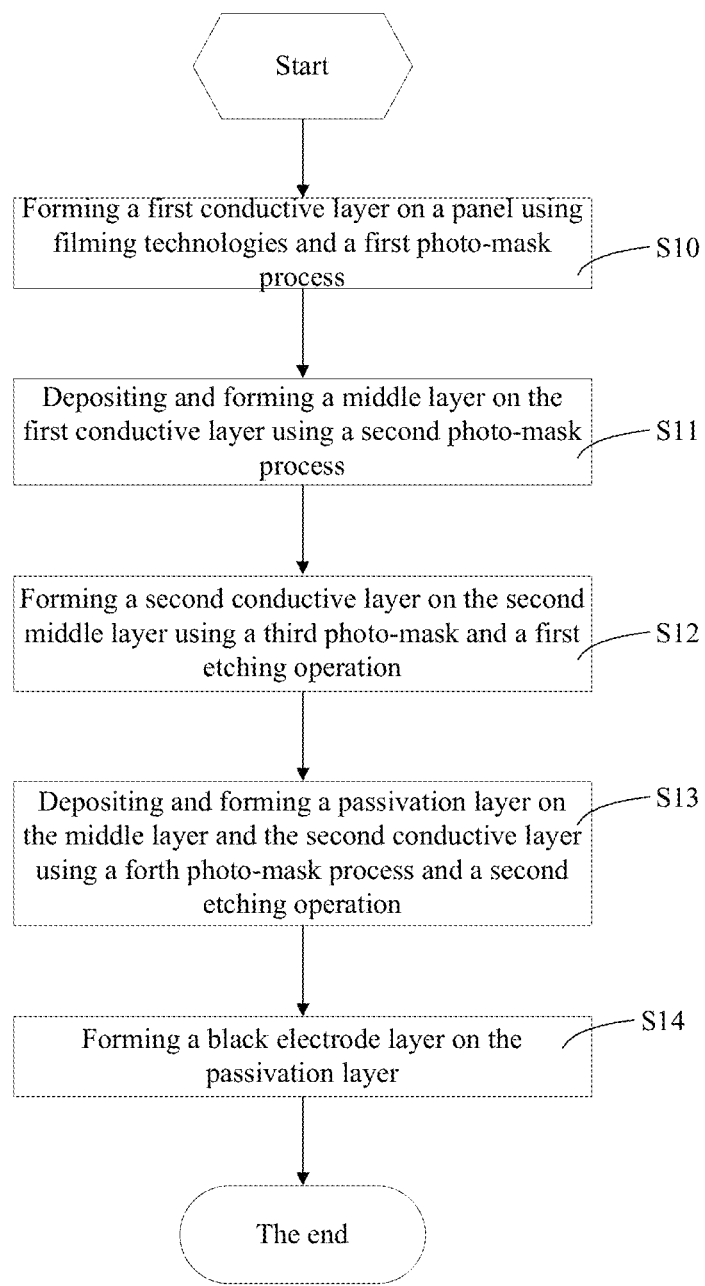
FIG. 3 is a flow chart of a manufacturing method of the TFT array structure of FIG. 1 in accordance with a first embodiment of the present disclosure.

Referring to FIG. 3, a manufacturing method of the TFT array structure in accordance with a first embodiment of the present disclosure is provided. The manufacturing method includes the following steps:

In step S10, forming a first conductive layer 21 on a panel 20 using filming technologies and a first photo-mask process.

In step S11, depositing and forming a middle layer 22 on the first conductive layer 21 using a second photo-mask process.

In step S12, forming a second conductive layer 23 on the middle layer 22 using a third photo-mask process and a first etching operation.

In step S13, depositing and forming a passivation layer on the middle layer 22 and the second conductive layer 23 using a forth photo-mask process and a second etching operation.

In step S14, forming a black electrode layer 25 on the passivation layer 24.

Figure 4:
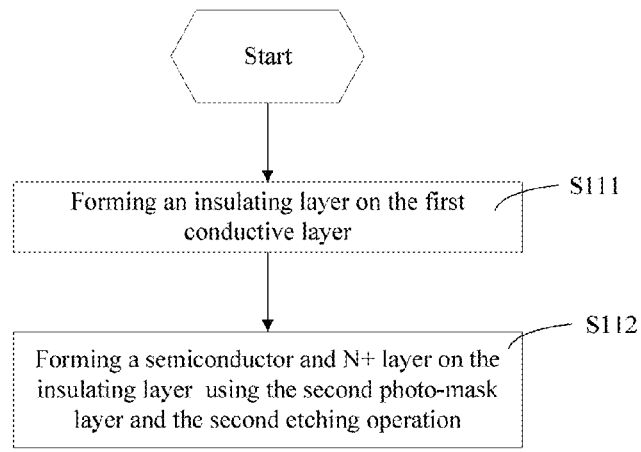
FIG. 4 is a flow chart of a manufacturing method of the TFT array structure of FIG. 1 in accordance with a second embodiment of the present disclosure.
Figure 5:
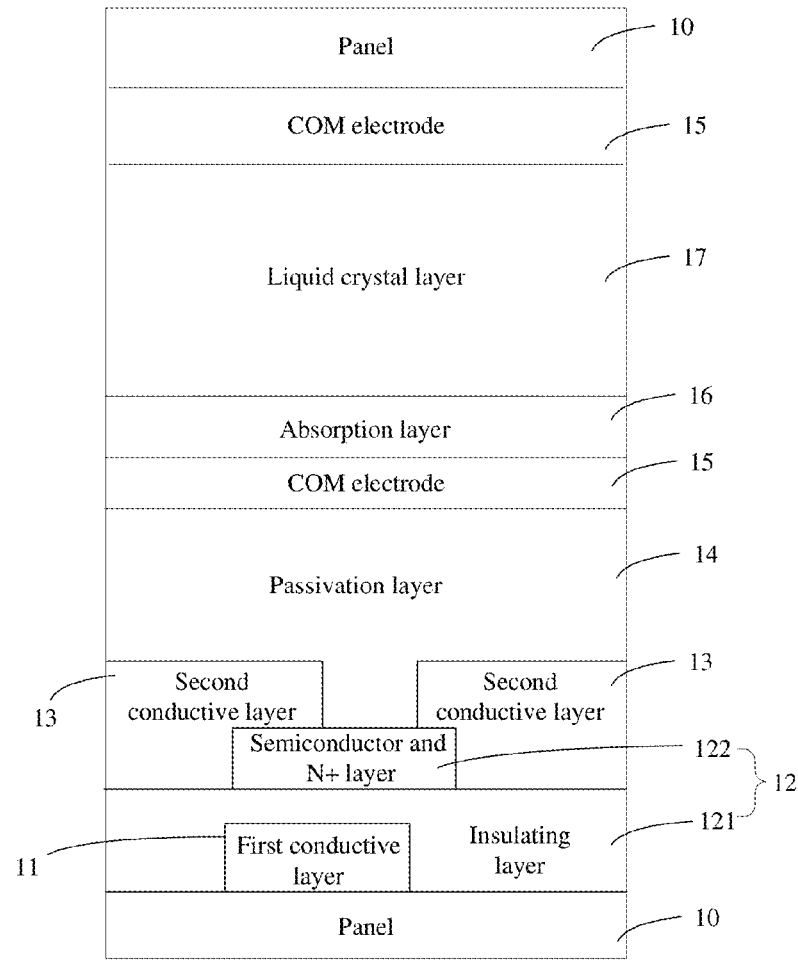
FIG. 5 is a schematic view of a conventional TFT array structure for a cholesteric LCD; the TFT array structure includes a semiconductor and $N^+$ layer, and the semiconductor is amorphous silicon.

Referring to FIG. 4, in a second embodiment, the step S11 further includes the following steps:

In step S111, depositing an insulating layer on the first conductive layer.

In step S112, forming a semiconductor and $N^+$ layer on the insulating layer using the second photo-mask process and the second etching operation.

In the TFT array structure manufactured according to the manufacturing method of the present disclosure, the black electrode replaces a COM electrode and an absorption layer in the conventional FTF array structure, and is formed on the passivation layer using traditional filming technologies, which not only reduces the manufacturing process of making the omitted COM electrode layer and the absorption layer, but also allows the liquid crystal layer to work under an external voltage high enough since there is no need to divide a part of the external voltage to the omitted COM electrode and the absorption layer. Therefore, the display effect of the LCD can be improved.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A thin film transistor array structure for a liquid crystal display, comprising:
   a panel;
   a first conductive layer formed on the panel using filming technologies and a first photo-mask process;
   a middle layer deposited and formed the first conductive layer using a second photo-mask process;
   a second conductive layer formed on the middle layer using a third photo-mask process and a first etching operation;
   a passivation layer deposited and formed the middle layer and the second conductive layer using a fourth photo-mask process and a second etching operation;
   a black electrode layer formed on the passivation layer wherein the black electrode layer comprises a pixel electrode and a thin film transistor light-shielding electrode which is electrically separated from the pixel electrode and is made of the same material as the pixel electrode.

2. The thin film transistor array structure as claimed in claim 1, wherein the middle layer comprises an insulating layer and a semiconductor and N+ layer sequentially formed on first conductive layer.

3. The thin film transistor array structure as claimed in claim 2, wherein the passivation layer is etched to define a contact hole.

4. The thin film transistor array structure as claimed in claim 3, wherein the black electrode layer is capable of filling in the contact hole to allow the black electrode layer to conduct with the second conductive layer.

5. The thin film transistor array structure as claimed in claim 1, wherein the passivation layer is etched to define a contact hole.

6. The thin film transistor array structure as claimed in claim 5, wherein the black electrode layer is capable of filling in the contact hole to allow the black electrode layer to conduct with the second conductive layer.

7. The thin film transistor array structure as claimed in claim 1, wherein the black electrode layer is made of conductive absorbable material.

8. A manufacturing method of a thin film transistor array structure, comprising the following steps:
   forming a first conductive layer on a panel using filming technologies and a first photo-mask process;
   depositing and forming a middle layer on the first conductive layer using a second photo-mask process;
   forming a second conductive layer on the middle layer using a third photo-mask process and a first etching operation;

depositing and forming a passivation layer on the middle layer and the second conductive layer using a fourth photo-mask process and a second etching operation;

forming a black electrode layer on the passivation layer wherein the black electrode layer comprises a pixel electrode and a thin film transistor light-shielding electrode which is electrically separated from the pixel electrode and is made of the same material as the pixel electrode.

9. The manufacturing method as claimed in claim 8, wherein the step of depositing a middle layer on the first conductive layer and forming the middle layer using a second photo-mask process comprises the following steps:

depositing an insulating layer on the first conductive layer;

forming a semiconductor and N+ layer on the insulating layer using the second photo-mask process and the second etching operation.

10. The manufacturing method as claimed in claim 9, wherein the step of depositing and forming a passivation layer on the middle layer and the second conductive layer using a fourth photo-mask process and a second etching operation further comprises the step of defining a contact hole in the passivation layer.

11. The manufacturing method as claimed in claim 10, wherein the step of depositing and forming a passivation layer on the middle layer and the second conductive layer using a fourth photo-mask process and a second etching operation further comprises the step of filling in the contact hole with the black electrode of the black electrode layer to allow the black electrode layer to conduct with the second conductive layer.

12. The manufacturing method as claimed in claim 10, wherein the step of forming the black electrode layer comprises the following step:

forming the black electrode layer on the passivation layer and filling in the contact hole with the black electrode layer;

etching the black electrode layer to form the pixel electrode filling the contact hole and the thin film transistor light shielding electrode.

13. The manufacturing method as claimed in claim 8, wherein the step of depositing and forming a passivation layer on the middle layer and the second conductive layer using a fourth photo-mask process and a second etching operation further comprises the step of defining a contact hole in the passivation layer.

14. The manufacturing method as claimed in claim 13, wherein the step of depositing and corming a passivation layer on the middle layer and the second conductive layer using a fourth photo-mask process and a second etching operation further comprises the step of filling in the contact hole with the black electrode layer to allow the black electrode layer to conduct with the second conductive layer.

15. The manufacturing method as claimed in claim 13, wherein the step of forming the black electrode layer comprises:

forming the black electrode layer on the passivation layer and filling in the contact hole with the black electrode layer;

etching the black electrode layer to form the pixel electrode filling the contact hole and the thin film transistor light shielding electrode.

16. A thin film transistor array structure for a liquid crystal display, comprising:

a panel;

a first conductive layer formed on the panel using filming technologies and a first photo-mask process;

a middle layer deposited and formed on the first conductive layer using a second photo-mask process, the middle layer comprising an insulating layer and a semiconductor and N+ layer sequentially formed on the first conductive layer;

a second conductive layer formed on the middle layer using a third photo-mask process and a first etching operation;

a passivation layer deposited and formed on the middle layer and the second conductive layer using a fourth photo-mask process and a second etching operation;

a black electrode layer formed on the passivation layer and made of conductive absorbable material wherein the black electrode layer comprises a pixel electrode and a thin film transistor light-shielding electrode which is electrically separated from the pixel electrode and is made of the same material as the pixel electrode.

17. The thin film transistor array structure as claimed in claim 16, wherein the passivation layer is etched to define a contact hole.

18. The thin film transistor array structure as claimed in claim 17, wherein the black electrode is capable of filling in the contact hole to allow the black electrode layer to conduct with the second conductive layer.

19. The thin film transistor array structure as claimed in claim 16, wherein the black electrode layer comprises a pixel electrode and a thin film transistor light-shielding electrode separated from the pixel electrode, and the light-shielding electrode fills in the contact hole and conducts with the second conductive layer.

* * * * *